US011624766B2

(12) United States Patent
Jungiewicz et al.

(10) Patent No.: US 11,624,766 B2
(45) Date of Patent: Apr. 11, 2023

(54) METHOD FOR MEASURING A PARTIAL DISCHARGE IN AN ELECTRIC DRIVE SYSTEM

(71) Applicant: Siemens Aktiengesellschaft, Munich (DE)

(72) Inventors: Artur Jungiewicz, Berlin (DE); Alija Obralic, Berlin (DE)

(73) Assignee: Siemens Aktiengesellschaft, Munich (DE)

( * ) Notice: Subject to any disclaimer, the term of this patent is extended or adjusted under 35 U.S.C. 154(b) by 129 days.

(21) Appl. No.: 16/972,951

(22) PCT Filed: May 15, 2019

(86) PCT No.: PCT/EP2019/062439
§ 371 (c)(1),
(2) Date: Dec. 7, 2020

(87) PCT Pub. No.: WO2019/233716
PCT Pub. Date: Dec. 12, 2019

(65) Prior Publication Data
US 2021/0247437 A1 Aug. 12, 2021

(30) Foreign Application Priority Data
Jun. 8, 2018 (EP) .................... 18176746

(51) Int. Cl.
*G01R 31/12* (2020.01)
*G01R 31/34* (2020.01)

(52) U.S. Cl.
CPC ....... *G01R 31/1272* (2013.01); *G01R 31/343* (2013.01)

(58) Field of Classification Search
CPC ............. G01R 31/1272; G01R 31/12; G01R 31/1227; G01R 31/1245; G01R 31/14;
(Continued)

(56) References Cited

U.S. PATENT DOCUMENTS 5,247,258 A * 9/1993 Tripier .................. G01R 31/12
361/111
7,112,968 B1 * 9/2006 Nishizawa ......... G01R 31/1272
324/536
(Continued)

FOREIGN PATENT DOCUMENTS

DE 102011080115 A1 1/2013
EP 2402775 A1 1/2012
(Continued)

OTHER PUBLICATIONS

Stone, G. C. (2005). Partial Discharge Diagnostics and Electrical Equipment Insulation Condition Assessment. IEEE Transactions on Dielectrics and Electrical Insulation, 12(5), 891-903. (Year: 2005).*
(Continued)

*Primary Examiner* — Daniel R Miller
*Assistant Examiner* — Eric Sebastian Von Wald
(74) *Attorney, Agent, or Firm* — Henry M. Feiereisen LLC

(57) ABSTRACT

A method for measuring a partial discharge in an electric drive system with an electric rotating machine and a converter during the operation of the electric drive system includes continuously analyzing a signal shape of a converter signal generated by the converter. A measurement signal is measured while the converter signal has a sinusoidal signal shape, and the measurement signal is compared with a reference signal. A partial discharge is detected when a deviation of the measurement signal from the reference signal exceeds a threshold value.

14 Claims, 3 Drawing Sheets

(58) Field of Classification Search
CPC ............. G01R 31/343; H03H 17/0233; H02H 1/0061; G01P 15/16; G01P 1/103; G01D 3/0365; G05B 23/00; G05B 23/0205; G05B 23/0218; G05B 23/0221; G05B 23/0224; G05B 23/024; G05B 23/0227; G01N 2201/1248

See application file for complete search history.

(56) References Cited

U.S. PATENT DOCUMENTS

| | | | |
|---|---|---|---|
| 9,390,067 B2* | 7/2016 | Garnacho Vecino | .......................... G01R 31/1272 |
| 2002/0097065 A1 | 7/2002 | Krahn et al. | |
| 2005/0035768 A1* | 2/2005 | Rabach | ................ G01R 31/346 324/546 |
| 2006/0022679 A1 | 2/2006 | Obata et al. | |
| 2014/0176152 A1 | 6/2014 | Wolbank | |
| 2015/0015303 A1* | 1/2015 | Sakurai | ............. G01R 19/0084 324/765.01 |
| 2017/0038424 A1 | 2/2017 | Ikegami et al. | |
| 2018/0217198 A1* | 8/2018 | Palme | ................ G01R 31/1263 |

FOREIGN PATENT DOCUMENTS

| | | |
|---|---|---|
| EP | 3136116 A1 | 3/2017 |
| RU | RU 2599910 C2 | 10/2016 |
| RU | 170695 U1 | 5/2017 |

OTHER PUBLICATIONS

Brown, M. (1997b). Siemens Standard Drives Application Handbook. Siemens Standard Drives. (Year: 1997).*

PCT International Examination Report and Written Opinion of International Examination Authority dated Aug. 3, 2019 corresponding to PCT International Application No. PCT/EP2019/062439 filed May 15, 2019.

* cited by examiner

METHOD FOR MEASURING A PARTIAL DISCHARGE IN AN ELECTRIC DRIVE SYSTEM

CROSS-REFERENCES TO RELATED APPLICATIONS

This application is the U.S. National Stage of International Application No. PCT/EP2019/062439, filed May 15, 2019, which designated the United States and has been published as International Publication No. WO 2019/233716 A1 and which claims the priority of European Patent Application, Serial No. 18176746.8, filed Jun. 8, 2018, pursuant to 35 U.S.C. 119(a)(d).

BACKGROUND OF THE INVENTION

The invention relates to a method for measuring a partial discharge in an electric drive system, which comprises an electric rotating machine and a converter.

Furthermore, the invention relates to a control unit with means for carrying out a method of this type.

Furthermore, the invention relates to a computer program for carrying out a method of this type when run in a control unit.

Moreover, the invention relates to a computer program product with a computer program.

Furthermore, the invention relates to a partial discharge measuring system for carrying out a method of this type.

In addition, the invention relates to a drive system having at least one electric rotating machine, at least one converter and at least one partial discharge measuring system.

A method of this type is used in drive systems, the converter-fed electric rotating machines, in particular motors, of which can be operated with a three-phase alternating voltage and a power of at least 1 MW. An electric rotating machine of this type has a supply voltage of at least 1 kV, for instance 6.6 kV.

As a result of inhomogeneities in the insulating material but also as a result of clearances between electric conductors which are not filled with insulating material, during operation of the electric rotating machine, partial discharges may occur, wherein a partial discharge corresponds to a not completely electric flashover, which occurs locally in an insulation, in particular at points of significantly inhomogeneous field profiles, and results in damage to the insulating material. This means that the partial discharges cause the ageing process to speed up.

Corresponding monitoring and diagnostic methods are therefore used for insulation systems. Aside from chemical insulation diagnoses, electric diagnostic methods are employed, which are used in particular for the insulation systems of stator windings. Until now electric partial discharge measurements could only be carried out offline, in other words when the electric rotating machine is at a standstill, since a smooth, sinusoidal voltage signal is required for the measurement. A sinusoidal signal of this type is fed in by way of a reference source while the system is at a standstill. Offline measurements are expensive as a result of the standstill of the system and the production failure associated therewith.

The unexamined patent application DE 10 2011 080 115 A1 describes a coupling-out unit for measuring the partial discharge on a high voltage machine. The electric components of the coupling-out unit are an integrated part of a plastic casting block, which is positioned on the top side of an insulation support. A series connection comprising two capacitors forms part of the electric components of the coupling-out unit.

The unexamined patent application US 2002/0097065 A1 describes a method for evaluating insulation errors in a motor with a variable speed.

The unexamined patent application US 2006/0022679 A1 describes a device for identifying the partial discharge of a three-phase current insulation in a motor.

The unexamined patent application EP 2 402 775 A1 describes an insulation check/diagnostic method for an electric rotating machine.

The unexamined patent application EP 3 136 116 A1 describes a partial discharge measuring device for measuring partial discharge properties which are observed when a repeated voltage surge is applied to an object to be measured.

The object underlying the invention is to specify a method for measuring a partial discharge in an electric drive system, which can be carried out during operation of the electric drive system.

SUMMARY OF THE INVENTION

The object is achieved according to the invention by a method for measuring a partial discharge in an electric drive system, which comprises an electric rotating machine and a converter, wherein a signal shape of a converter signal generated by the converter is analyzed continuously, wherein a measuring signal is detected while the converter signal has a sinusoidal signal shape, wherein the measuring signal is compared with a reference signal, wherein a partial discharge is detected while a deviation of the measuring signal from the reference signal exceeds a threshold value.

Furthermore, the object is achieved according to the invention by a control unit having means for carrying out a method of this type.

Furthermore, the object is achieved according to the invention by a computer program for carrying out a method of this type when run in a control unit.

In addition, the object is achieved according to the invention by a computer program product with a computer program of this type.

Furthermore, the object is achieved according to the invention by a partial discharge measuring system for carrying out a method of this type, which has at least one signal analysis device, a partial discharge measuring device and a control unit.

Moreover, the object is achieved according to the invention by a drive system having at least one electric rotating machine, at least one converter and at least one partial discharge measuring system.

The advantages and preferred embodiments cited below with respect to the method can be transferred analogously to the control unit, the computer program, the computer program product, the partial discharge measuring system, and the drive system.

The idea underlying the invention is to detect partial discharges during the operation of a drive system, wherein a drive system of this type is formed by an electric rotating machine and a converter, which is provided for operation of the electric rotating machine with a, in particular three-phase, alternating current signal. The electric rotating machine can be operated with an operating voltage of at least 1 kV, for instance with 6.6 kV, in motor operation or generator operation. An online measurement of this type during operation requires a smooth sinusoidal alternating current signal, which can seldom be achieved in converter operation, compared with network operation. During the switching processes of the converter, voltage jumps occur, which overlap the measured partial discharge signals and as a result prevent a diagnosis.

In order to enable a partial discharge measurement to be carried out during operation of the drive system, a signal shape of the in particular three-phase alternating current signal generated by the converter, which is known as converter signal, is analyzed continuously. As soon as the converter signal has a sinusoidal course, the partial discharge measurement is carried out, by a measuring signal being detected on the electric rotating machine. Thereupon the measuring signal is compared with a reference signal, in particular by means of a digital differentiation. A partial discharge is detected if a deviation in the measuring signal from the reference signal exceeds a threshold value.

The partial discharges are detected by a partial discharge measuring system, which comprises a signal analysis device for analyzing the course of the converter signal and a partial discharge measuring device, which is arranged in the region of the electric rotating machine.

The procedure is controlled by a control unit. The means for carrying out a method of this type comprise a computer program and for instance a micro controller or another programmable logic module. The control unit is arranged in the partial discharge measuring device, for instance.

A, in particular digital, trigger signal assumes a first state for detecting the measuring signal, as soon as the converter signal has a sinusoidal signal shape. By means of the trigger signal, detection of the measuring signal is started reliably and as a result of a very small delay, which results in a longer detection time and thus in greater accuracy.

In a preferred embodiment, a number and/or a duration of the partial discharges are determined. Information of this type enables conclusions to be drawn with respect to the aging process of the insulating material. For instance, prompt maintenance allows further damage to the electric rotating machine and/or long failure times to be prevented.

The, in particular digital, trigger signal particularly advantageously assumes a second state for the purpose of interrupting the detection of the measuring signal, as soon as the converter signal deviates from the sinusoidal signal shape. A, in particular digital, trigger signal of this type is reliable, less prone to error and easy to implement.

In a further advantageous embodiment, a trigger signal is generated in a signal analysis device or in an IT infrastructure. An IT infrastructure is for instance at least a local computer system and/or a cloud. The IT infrastructure provides storage space, computing power and/or application software. Storage space, computing power and/or application software are made available in the cloud as services via the Internet. A synchronous signal processing is ensured by a central generation of the trigger signal of this type.

With a further advantageous embodiment, the signal shape of the converter signal is analyzed by means of an FFT. FFT stands for Fast Fourier Transformation. By using an FFT, it is possible to determine with high accuracy and speed whether and when the signal shape of the converter signal is sinusoidal.

In a preferred embodiment, the measuring signal is tapped at at least one supply line of a stator winding system of the electric rotating machine. A tap of this type is easily accessible and can be realized in particular by means of existing support insulators in a cost-effective manner and without significant structural changes.

With a further advantageous embodiment, the measuring signal is tapped at least one coil of the stator winding system of the electric rotating machine. A direct tap at a coil enables a very accurate measurement.

In a further advantageous embodiment, the measuring signal is tapped by way of a, in particular capacitive, voltage divider. In particular, at least one capacitor with a capacitance in the pF range is integrated into a support insulator, wherein a further capacitor has a capacitance in the pF range, so that a maximum drop of 50V occurs at the further capacitor, for instance. In addition or alternatively, the voltage divider is structured with resistors. A voltage divider of this type is robust and not prone to error. The measuring signal can therefore be tapped, for instance, at the further capacitor easily and reliably.

In a preferred embodiment, the measuring signal is digitized in particular with a scanning rate of at least 10 MS/s. On account of a high scanning rate of this type, short steep signal edges of the partial discharges can also be detected reliably.

Particularly advantageously the digitized measuring signal is further processed at least partially in the central IT infrastructure. On account of an IT infrastructure of this type, the determined data is also reliably processed and, where necessary, stored even in difficult environmental conditions in the region of the electric rotating machine, for instance heat, humidity, or radiation.

BRIEF DESCRIPTION OF THE DRAWING

The invention is described and explained in more detail below on the basis of the exemplary embodiments shown in the figures. In the drawings.

DETAILED DESCRIPTION OF PREFERRED EMBODIMENTS

The exemplary embodiments explained below are preferred embodiments of the invention. In the exemplary embodiments, the described components of the embodiments each constitute individual features of the invention to be considered independently of one another, which develop the invention in each case also independently of one another and hence can also be considered to be part of the invention individually or in a different combination from that shown. In addition, further features of the invention that have already been described can also be added to the described embodiments.

The same reference signs have the same meaning in the different figures.

Figure 1:
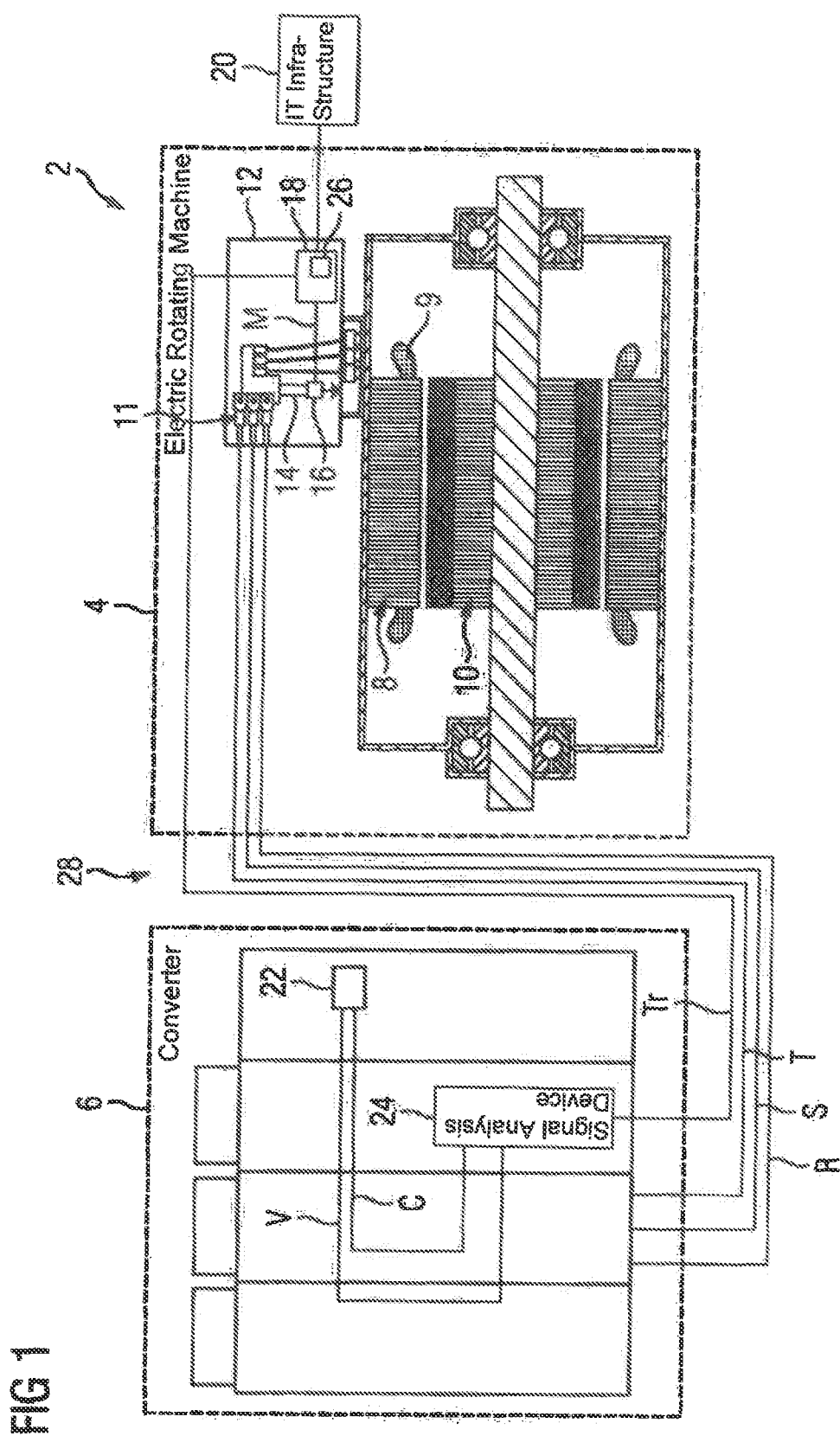
FIG. 1 shows a schematic representation of a first embodiment of a drive system.

FIG. 1 shows a schematic representation of a first embodiment of a drive system 2, which comprises a three-phase electric rotating machine 4 and a converter 6. The electric rotating machine 4 is a motor, for instance, and comprises a stator 8 with a stator winding system 9, and a rotor 10. The electric rotating machine 4 is supplied from the converter 6, which is embodied as a load-commutated current indirect converter, with a multiphase, in particular three-phase, power signal, the converter signal R, S, T.

The converter signal R, S, T is fed by way of supply lines 11 into a terminal box 12 in the electric rotating machine 4.

Support insulators 14, wherein at least one support insulator 14 is provided for instance for each phase of the converter signal R, S, T, are located in the terminal box 12. For reasons of clarity, only one support insulator 14 is shown in FIG. 1. The support insulators 14 are connected via a rail to the earthed housing of the terminal box 12 and support the supply lines 11 for the stator winding system 9. At least one capacitor is integrated into the support insulators. A sensor 16 which comprises a further capacitor, for instance, which forms a capacitive voltage divider with the at least one capacitor integrated in the support insulator 14, is connected to a capacitor of the support insulator 14. In addition or alternatively, the sensor 16 has a resistor. A measuring signal which is proportional to the respective phase of the converter signal R, 3, T is tapped at the further capacitor. In particular, with a high voltage machine, which can be operated with an operating voltage of at least 1 kV, the measuring signal M can be tapped by way of a network, which has at least one capacitor, essentially without loss and with a significantly lower level, which facilitates the further signal processing. In addition or alternatively, a measuring signal M is tapped at a coil of the stator winding system 9.

The digital measuring signal M is routed to a partial discharge measuring device 18 and digitized for further processing. Alternatively, the sensor 16 additionally comprises a converter unit, which converts the analog voltage signal dropping at the further capacitor into a digital measuring signal M. In order also to be able to detect very steep signal edges of the partial discharges Te, the converter is operated with a high scanning rate, for instance in the mega-sample range or in the giga-sample range.

The digitized measuring signal M is then compared with a reference signal Rs, which is generated for instance by the partial discharge measuring device 18 from the converter signal R, S, T. A comparison of the measuring signal M with the reference signal Rs is carried out digitally by means of differentiation, for instance. If a deviation of the measuring signal M from the reference signal Rs exceeds a threshold value Sw, a partial discharge Te is detected. A number and/or a duration of the partial discharges Te is determined. The determined data relating to the partial discharges Te are digitized and sent at least partially to a central IT infrastructure 20. An IT infrastructure 20 is for instance at least one local computer system and/or a cloud. The IT infrastructure 20 provides storage space, computing power and/or application software. Storage space, computing power and/or application software are made available in the cloud as services via the Internet. The digital data transmission to the IT infrastructure 20 takes place in a wireless, wired, or visual manner. For instance, the data is transmitted by way of Bluetooth or WLAN.

Partial discharges Te can be detected without interruption by means of an online measurement, in other words during the operation of the electric rotating machine 4, only with a sinusoidal course of the converter signal R, S, T generated by the converter, wherein the converter signal R, S, T of the converter 6, which is embodied as a load-commutated indirect converter, partially has a sinusoidal course.

A, in particular three-phase, analog voltage signal V and a, in particular three-phase, analog current signal C is transmitted to a signal analysis device 24 by way of an interface 22 at the converter 6, wherein the analog voltage signal V and the analog current signal C are preferably tapped at the output of the converter 6, and reproduce the course of the three-phase converter signal R, S, T. High-resolution measuring data is provided by the signal analysis device 24, with the aid of which the signal shape of the converter signal R, 5, T is analyzed in particular by means of an FFT. A, in particular, digital trigger signal Tr is generated from the signal shape of the converter signal R, S, T. The trigger signal Tr assumes a first state, for instance a logical 1, as soon as the converter signal R, S, T has a smooth sinusoidal course. If the course of the converter signal R, S, T is not sinusoidal, the trigger signal Tr has a second state, for instance a logical 0.

Figure 2:
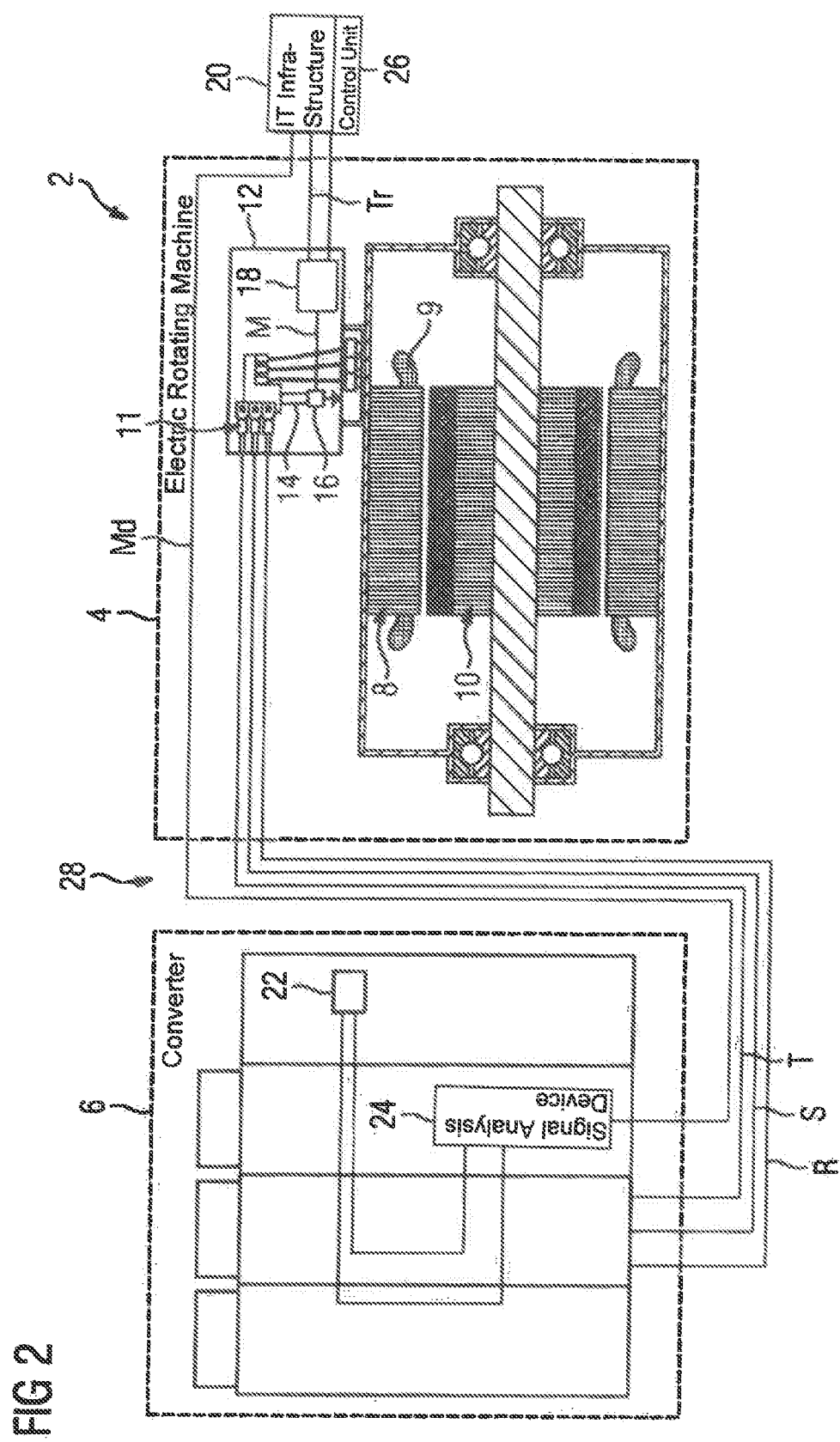
FIG. 2 shows a schematic representation of a second embodiment of a drive system and FIG. 3 shows a schematic representation of the temporal course of the analysis of the measuring signal.

As a result of the trigger signal Tr of the signal analysis device 24, the measurement by the partial discharge measuring device 18 is only activated with a correspondingly sinusoidal course of the converter signal R, S, T; otherwise this remains deactivated, since no interference-free measurement is possible. A digital coupling is therefore realized between the switching processes of the converter 6 and the actuation of the partial discharge measuring device 18, by means of which an online measurement of partial discharges Te is enabled on the electric rotating machine 4, which is driven by a load-commutated current indirect converter. The procedure is controlled by a control unit 26, which is assigned to the partial discharge measuring device 18. The control unit 26 forms, together with the signal analysis device 24 and the partial discharge measuring device 18, a partial discharge measuring system 28, FIG. 2 shows a schematic representation of a second embodiment of a drive system 2. The high-resolution measuring data provided by the signal analysis device 24 is sent as a measuring data signal Md to the IT infrastructure 20. There the signal shape of the converter signal R, S, T, is analyzed with the aid of the high-resolution measuring data, in particular by means of an FFT. The, in particular, digital trigger signal Tr, which is sent to the partial discharge measuring device 18, is generated from the signal shape of the converter signal R, S, T.

The procedure is controlled by the control unit 26, which is assigned to the IT infrastructure 20. After digitization in the partial discharge measuring device 18 the measuring signal M and the reference signal Rs are sent to the central IT infrastructure 20 and further processed there. The further embodiment of the drive system 2 in FIG. 2 corresponds to that in FIG. 1.

Figure 3:
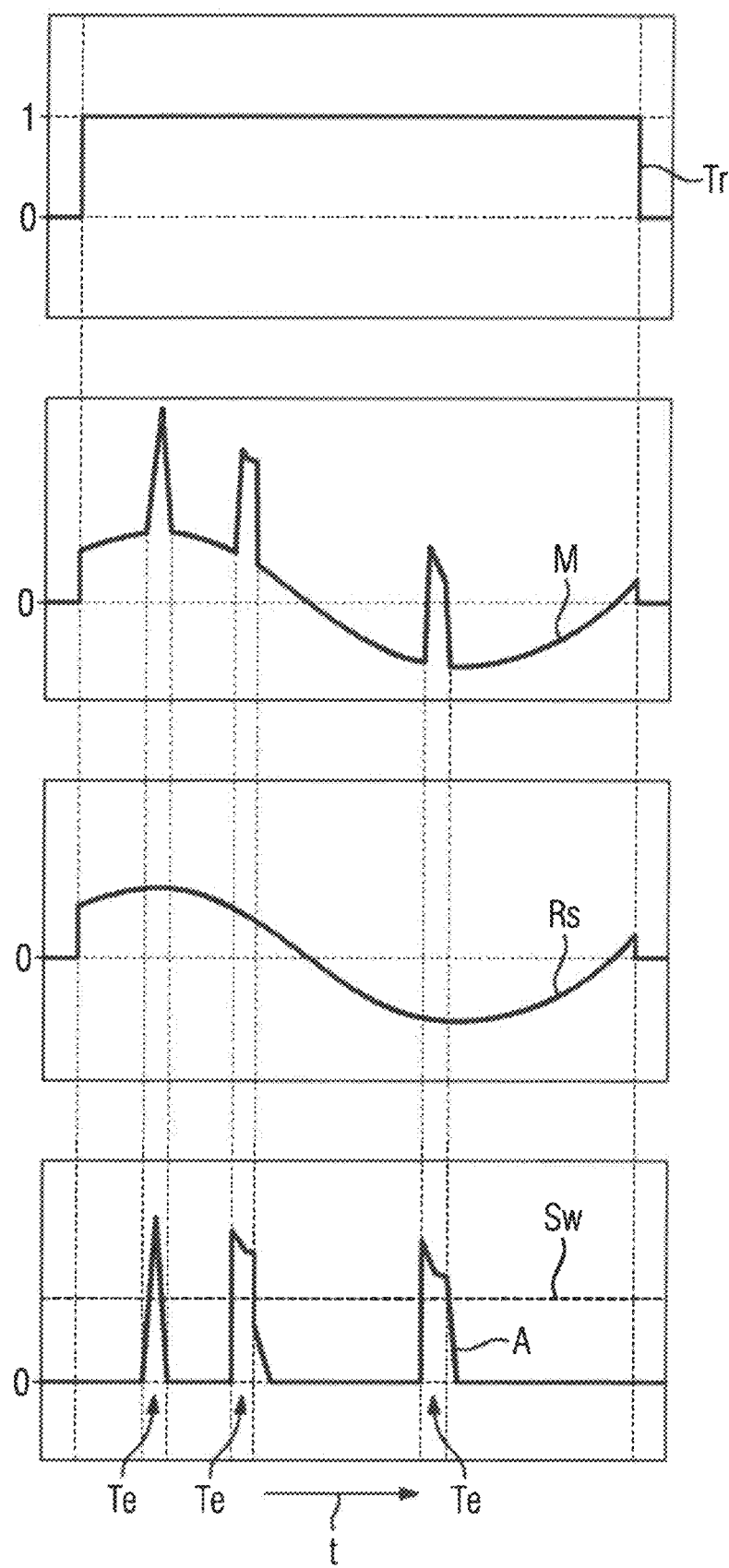

FIG. 3 shows a schematic representation of the temporal course of the analysis of the measuring signal M. If the trigger signal Tr with a sinusoidal course of the converter signal R, S, T generated by the converter assumes a logical 1, the detection of the measuring signal M is started. The reference signal Rs is subtracted from the measuring signal M, wherein a deviation signal A of the measuring signal M from the reference signal is generated. If the deviation signal A exceeds a threshold value Sw, a partial discharge Te is detected. A number and/or a duration of the partial discharges Te is thereupon determined.

In summary, the invention relates to a method for measuring a partial discharge Te in an electric drive system 2, which comprises an electric rotating machine 4 and a converter 6. To ensure that the method can be carried out during the operation of the electric drive system 2, it is proposed that a signal shape of a converter signal R, S, T generated by the converter 6 is analyzed continuously, wherein a measuring signal M is detected while the converter signal R, S, T has a sinusoidal signal shape, wherein the measuring signal M is compared with a reference signal Rs, wherein a partial discharge Te is detected while a deviation A of the measuring signal M from the reference signal Rs exceeds a threshold value Sw.

The invention claimed is:

1. A method for measuring a partial discharge in an electric drive system having an electric rotating machine and a converter, said method comprising:
   continuously analyzing a signal shape of a converter signal generated by the converter, wherein the continuously analyzing comprises:
      determining that the shape of the converter signal has a smooth sinusoidal signal shape during a first time period; and
      determining that the converter signal deviates from the smooth sinusoidal shape during a second time period;
   during the first time period and in response to the determination that the converter signal has a smooth sinusoidal signal shape:
      causing a digital trigger signal to assume a first state and starting a measurement of a measuring signal;
      comparing the measurement with a reference signal generated by the converter signal;
      detecting the partial discharge when a deviation of the measurement from the reference signal exceeds a threshold value, and
   during the second time period and in response to the determination that the converter signal deviates from the smooth sinusoidal signal shape, causing the digital trigger signal to assume a second state, and interrupting the measurement of the measuring signal.

2. The method of claim 1, further comprising determining a number or a duration of the partial discharge.

3. The method of claim 1, wherein the trigger signal is generated in a signal analysis device or in an IT infrastructure.

4. The method of claim 1, wherein the signal shape of the converter signal is analyzed by means of a Fast-Fourier transform (FFT).

5. The method of claim 1, wherein the measuring signal is tapped at a supply line of a stator winding system of the electric rotating machine.

6. The method of claim 1, wherein the measuring signal is tapped at a coil of a stator winding system of the electric rotating machine.

7. The method of claim 1, wherein the measuring signal is tapped at a voltage divider.

8. The method of claim 7, wherein the voltage divider is a capacitive voltage divider.

9. The method of claim 1, further comprising digitizing the measuring signal.

10. The method of claim 9, wherein the measuring signal is digitized with a sampling rate of at least 10 MS/s.

11. The method of claim 9, wherein the digitized measuring signal is further processed at least partially in a central IT infrastructure.

12. A computer program embodied in a computer-readable non-transitory medium and comprising machine code, which when read into a memory of a control unit, which controls a partial discharge measuring system in an electric drive system having an electric rotating machine and a converter, and executed by the control unit, causes the control unit to
   continuously analyze a signal shape of a converter signal generated by the converter,
   when the converter signal has a smooth sinusoidal signal shape, cause a digital trigger signal to assume a first state and start a measurement of a measuring signal;
   compare the measurement with a reference signal generated by the converter signal;
   detect the partial discharge when a deviation of the measurement from the reference signal exceeds a threshold value, and
   when the converter signal deviates from the smooth sinusoidal signal shape during the measurement, cause the digital trigger signal to assume a second state, and interrupt the measurement of the measuring signal.

13. A partial discharge measuring system in an electric drive system including an electric rotating machine and a converter, said partial discharge measuring system comprising:
   a sensor disposed at the electric rotating machine;
   a signal analysis device at the converter receiving analog current and voltage signals representing a reference signal generated by the converter,
   a partial discharge measuring device receiving from the sensor a measuring signal associated with a respective phase of the reference signal; and
   a control unit configured to
      continuously analyze a signal shape of the converter signal,
      when the converter signal has a smooth sinusoidal signal shape, cause a digital trigger to assume a first state and start a measurement of the measuring signal,
      compare the measurement with the reference signal,
      detect the partial discharge when a deviation of the measurement from the reference signal exceeds a threshold value, and
      when the converter signal deviates from the smooth sinusoidal signal shape during the measurement, cause the digital trigger signal to assume a second state and interrupt the measurement of the measuring signal.

14. A drive system comprising:
   a converter having a signal analysis device receiving analog current and voltage signals representing a reference signal generated by the converter,
   an electric rotating machine receiving from the converter a converter signal, and
   a partial discharge measuring device receiving from a sensor disposed at the electric rotating machine a measuring signal associated with a respective phase of the reference signal; and
   a control unit configured to
      continuously analyze a signal shape of the converter signal,
      when the converter signal has a smooth sinusoidal signal shape, cause a digital trigger signal to assume a first state and start a measurement of the measuring signal,
      compare the measurement with the reference signal,
      detect the partial discharge when a deviation of the measurement from the reference signal exceeds a threshold value, and
      when the converter signal deviates from the smooth sinusoidal signal shape during the measurement, cause the digital trigger to assume a second state and interrupt the measurement of the measuring signal.

* * * * *